US010996805B2

(12) United States Patent
Hamada et al.

(10) Patent No.: US 10,996,805 B2
(45) Date of Patent: May 4, 2021

(54) DISPLAY DEVICE

(71) Applicant: Japan Display Inc., Tokyo (JP)

(72) Inventors: Yuki Hamada, Tokyo (JP); Hajime Akimoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/044,637

(22) Filed: Jul. 25, 2018

(65) Prior Publication Data
US 2019/0050078 A1 Feb. 14, 2019

(30) Foreign Application Priority Data

Aug. 10, 2017 (JP) .............................. JP2017-155226

(51) Int. Cl.
*G06F 3/044* (2006.01)
*H05K 1/11* (2006.01)
(Continued)

(52) U.S. Cl.
CPC .......... *G06F 3/0445* (2019.05); *G06F 3/0446* (2019.05); *H05K 1/0213* (2013.01);
(Continued)

(58) Field of Classification Search
CPC ............... H01L 51/524; H01L 27/3279; H01L 51/5203; H01L 51/5215; H01L 51/5218; H01L 51/5212; H01L 51/5234; H01L 51/5253; H01L 51/5012; H01L 27/3276; H01L 27/323; H01L 27/3246; H01L 27/3295; H01L 27/1203; H01L 27/3218; H01L 27/3244; H01L 27/124; G06F 2203/04111; G06F 2203/04112; G06F 3/0445; G06F 3/0446; G06F 3/0448; G06F 3/047; G06F 3/0443; G06F 3/04164; G06F 3/0416; G06F 3/045; G06F 3/041; G06F 3/044; G06F 3/0412; G06F 2203/04103; G06F 2203/04106; G06F 2203/04804; H03K 2017/9602; H03K 2017/9604; G09G 3/3208; G09G 3/3225; G09G 3/3648;
(Continued)

(56) References Cited

U.S. PATENT DOCUMENTS

2011/0032209 A1* 2/2011 Kim ...................... G06F 3/0446
345/174
2013/0341651 A1* 12/2013 Kim .................... G02F 1/13338
257/84
(Continued)

FOREIGN PATENT DOCUMENTS

JP 2014-106974 A 6/2014
JP 2016-508648 A 3/2016

*Primary Examiner* — Nitin Patel
*Assistant Examiner* — Amen W. Bogale
(74) *Attorney, Agent, or Firm* — Michael Best & Friedrich LLP

(57) ABSTRACT

A display device comprising: a display region including a first pixel and a second pixel arranged apart from each other, and a third pixel, and a touch sensor includes a first sensor electrode and a second sensor electrode, wherein the touch sensor overlaps the display region, the first sensor electrode has an opening part in a region overlapping the first pixel and the second pixel, and surrounding the first pixel and the second pixel, and the second sensor electrode overlapping the third pixel.

12 Claims, 13 Drawing Sheets

(51) Int. Cl.
*H05K 1/02* (2006.01)
*G06F 3/041* (2006.01)
*H01L 51/52* (2006.01)
*H01L 27/32* (2006.01)

(52) U.S. Cl.
CPC ............ H05K 1/118 (2013.01); *G06F 3/0412* (2013.01); *G06F 2203/04103* (2013.01); *G06F 2203/04111* (2013.01); *G06F 2203/04112* (2013.01); *H01L 27/323* (2013.01); *H01L 51/5284* (2013.01)

(58) Field of Classification Search
CPC ...... G09G 3/367–3696; G02F 2201/12; G02F 2201/52; G02F 2001/134318; G02F 2001/136295; G02F 1/13338; G02F 1/13439; G02F 1/1343; G02F 1/134309; G02F 1/33553; G02F 1/13345; G02F 1/1333; G02F 1/136286; G02F 1/1362
See application file for complete search history.

(56) References Cited

U.S. PATENT DOCUMENTS

| | | | |
|---|---|---|---|
| 2014/0138143 A1 | 5/2014 | Lee et al. | |
| 2014/0192018 A1* | 7/2014 | Kurasawa | G06F 3/044 345/174 |
| 2015/0049047 A1* | 2/2015 | Liao | G06F 3/044 345/174 |

* cited by examiner

DISPLAY DEVICE

CROSS REFERENCE TO RELATED APPLICATIONS

This application is based upon and claims the benefit of priority from the prior Japanese Patent Application No. 2017-155226, filed on Aug. 10 2017, the entire contents of which are incorporated herein by reference.

FIELD

One embodiment of the present invention is related to a display device.

BACKGROUND

In a display device arranged with a display element such as an organic electroluminescence element, devices equipped with a touch sensor have become widespread. Japanese Laid Open Patent Application No. 2014-106974 and Japanese Translation of PCT International Application Publication No. 2016-508648 disclose that a wiring of a touch panel is formed by a sensor electrode formed in a mesh shape using a metal material.

SUMMARY

One embodiment of the present invention is a display device comprising: a display region including a first pixel and a second pixel arranged apart from each other, and a third pixel, and a touch sensor includes a first sensor electrode and a second sensor electrode, wherein the touch sensor overlaps the display region, the first sensor electrode has an opening part in a region overlapping the first pixel and the second pixel, and surrounding the first pixel and the second pixel, and the second sensor electrode overlapping the third pixel.

One embodiment of the present invention is a method of manufacturing a display device including forming a sealing layer on a substrate arranged with a first pixel and a second pixel arranged apart from each other and a third pixel, forming a first sensor electrode above the sealing layer including an opening part overlapping the first pixel and the second pixel, the first sensor electrode surrounding the first pixel and the second pixel, forming an insulation layer above the sealing layer so as to cover the first sensor electrode, and forming a second sensor electrode at a position overlapping the third pixel above the insulation layer.

DESCRIPTION OF EMBODIMENTS

Figure 1:
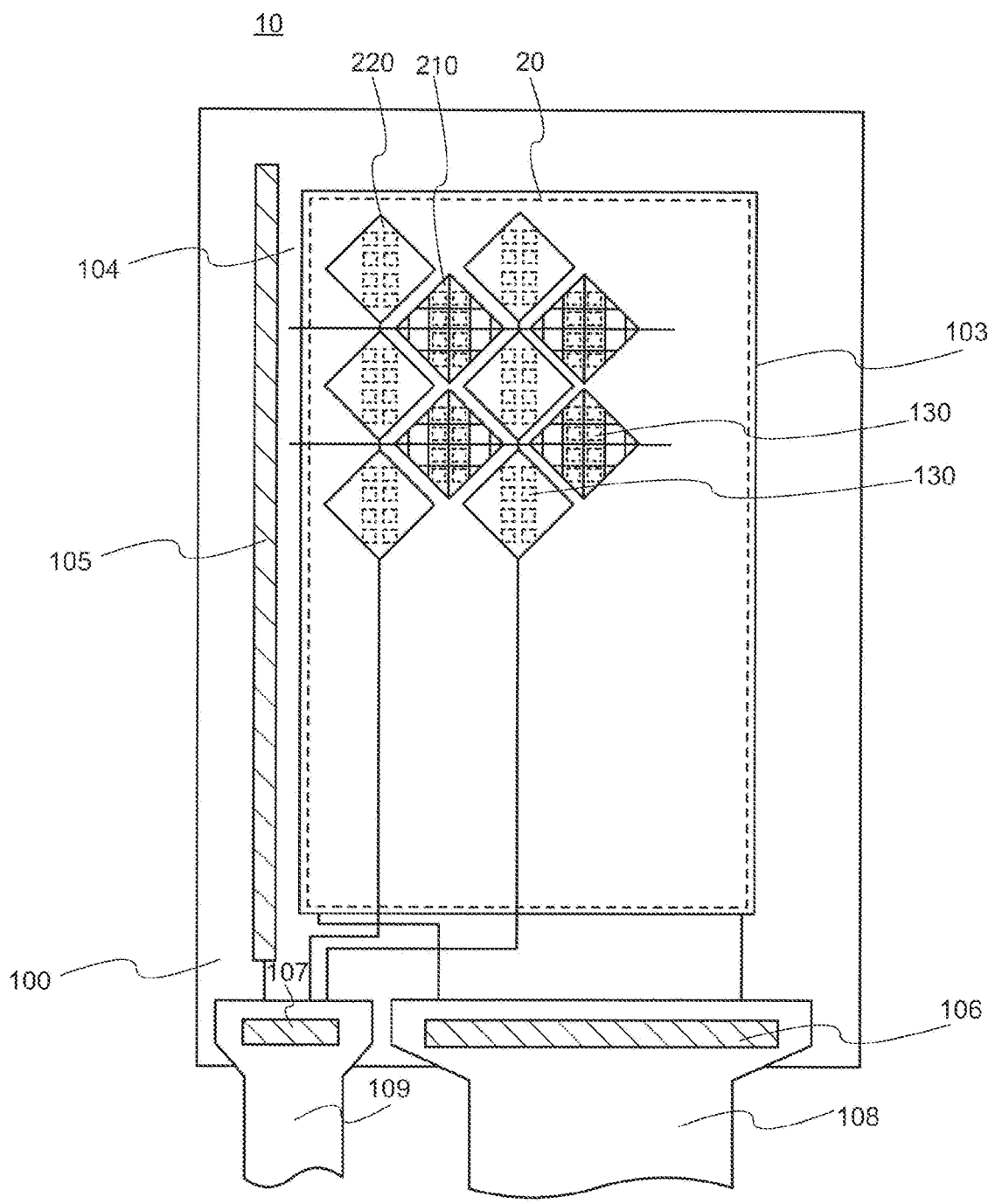
FIG. 1 is a top view showing a structure of a display device related to one embodiment of the present invention.

Each embodiment of the present invention is explained below referring to the diagrams. Furthermore, the disclosure is merely an example and those things that a person ordinarily skilled in the art could easily conceive of with respect to appropriate modifications maintaining the gist of the invention are naturally to be contained in the scope of the present invention. In addition, although the drawings may be schematically represented with respect to the width, thickness and shape and the like of each part as compared with their actual mode in order to make the explanation more clear, it is only an example and should not limit an interpretation of the present invention.

In addition, in the present specification and each diagram, the same reference numerals are attached to the same elements as those described with reference to preceding diagrams, and a detailed explanation may be omitted as appropriate. Furthermore, characters denoted as "first" and "second" for each element are convenience signs used for distinguishing each element and do not have any further meanings unless otherwise explained.

In addition, in the present specification, when a certain member or region is referred to as "above (or below)" another member or region, unless there is a specific limitation, this includes not only the case where it is directly above (or directly below) the certain member or region but also the case where it is above (or below) another member or region, that is, the case when another structural component is included between above (or below) the certain member or region. Furthermore, in the following explanation, unless otherwise specified, the side on which a display element is arranged with respect to a substrate in a cross-sectional view is referred to as (upper) or (upper surface), and the opposite side is referred to as (lower) or (lower surface).

In the present specification, the expressions "α includes A, B or C", "α includes any one of A, B, and C" and "α includes one selected from a group comprised from A, B and C" does not exclude the case where α includes a plurality of combinations of A to C unless otherwise specified. Furthermore, these expressions do not exclude the case where α includes other elements.

In a step of forming an electrode (referred to below as a [sensor electrode]) used for a touch sensor above a display element, the temperature range which can be used may be limited in order to prevent the display element from being damaged by heat. In this case, the resistance of the sensor electrode can easily increase. When the resistance of the sensor electrode is high, the time for writing in a circuit becomes long, and the detection speed of the touch sensor can decrease. In the case where the sensor electrode is formed from a metal material for example, the resistance of the sensor electrode is low. However, in the case when the sensor electrode overlaps a light emitting region of a pixel, the sensor electrode blocks light from the light emitting region. As a result, it becomes difficult for light to pass through to the outside of the display device, which may be a cause of a decrease in display performance.

In view of the above problems, one aim of the following embodiments is to improve the detection speed of a touch sensor and suppressing a reduction in display performance.

1. Structure of Display Device

FIG. 1 shows a top view of a display device 10 according to one embodiment of the present invention.

The display device 10 is an organic EL display device. The display device 10 is arranged with a substrate 100, a display region 103, a periphery part 104, a drive circuit 105, a drive circuit 106, a drive circuit 107, a first flexible printed substrate 108, a second flexible printed substrate 109, and a touch sensor 20. The drive circuit 105 includes a function as a gate driver. The drive circuit 106 has a function as a source driver. The drive circuit 107 has a function of controlling the touch sensor. The display region 103 includes, for example, a plurality of pixels 130 arranged in a lattice shape. In the present embodiment, the plurality of pixels 130 are arranged apart from each other.

A signal (for example, an image signal or a control signal) is input to the drive circuit 105 and the drive circuit 106 via the first flexible printed substrate 108. The drive circuit 105 and the drive circuit 106 are drive circuits for making the pixels 130 emit light. The display region 103 is a region for displaying still images and moving images. The drive circuit 107 is arranged, for example, on the second flexible printed substrate 109 of display device 10. The functions of the drive circuit 106 and the drive circuit 107 may be realized by a single drive circuit.

The touch sensor 20 overlaps the display region 103. Here, the touch sensor 20 is an on-cell type touch sensor. An on-cell type sensor is a method for incorporating a touch sensor in a display device. The touch sensor 20 includes a plurality of first sensor electrodes 210 and a plurality of second sensor electrodes 220. Each of the plurality of first sensor electrodes 210 and the plurality of second sensor electrodes 220 overlaps the display region 103.

2. Structure of Touch Sensor 20

Figure 2:
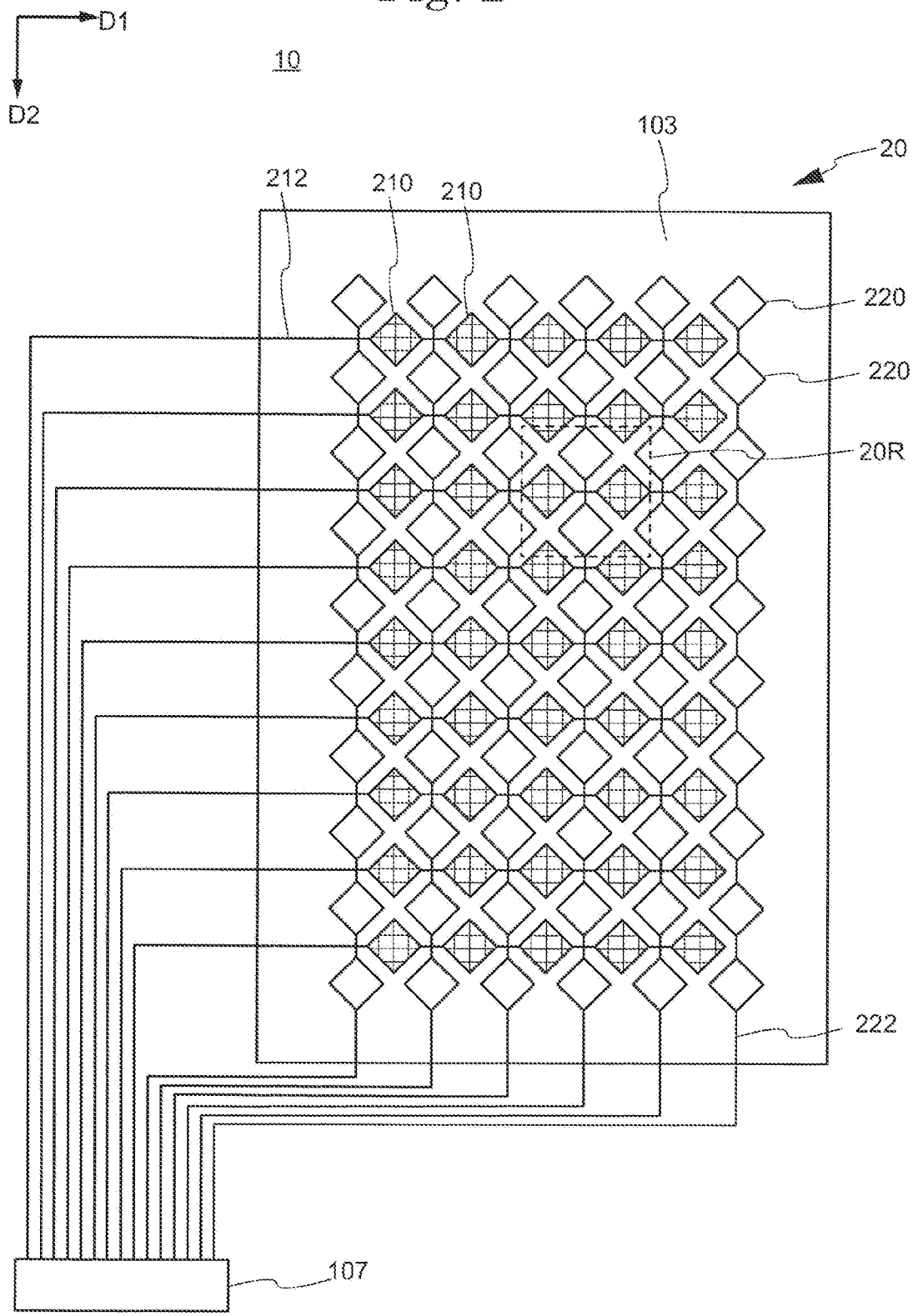
FIG. 2 is a top view showing a touch sensor related to one embodiment of the present invention.

FIG. 2 is a top view showing the touch sensor 20. The touch sensor 20 is a mutual capacitance type touch sensor. Each of the plurality of first sensor electrodes 210 and the plurality of second sensor electrodes 220 included in the touch sensor 20 is electrically connected to the drive circuit 107.

A plurality of the first sensor electrodes 210 are arranged along the short side direction (referred to as "direction D1" below) of the display region 103. Wiring including the plurality of first sensor electrodes 210 arranged along the direction D1 is referred to below as "first touch sensor wiring 212". A plurality of second sensor electrodes 220 are arranged along the long side direction (referred to below as "direction D2") of the display region 103. Wiring including the plurality of second sensor electrodes 220 arranged along the direction D2 is referred to below as "second touch sensor wiring 222". The direction D1 and direction D2 intersect each other. The first sensor electrode 210 is a transmission electrode in the touch sensor 20. The second sensor electrode 220 is a receiving electrode in the touch sensor 20.

Figure 3:
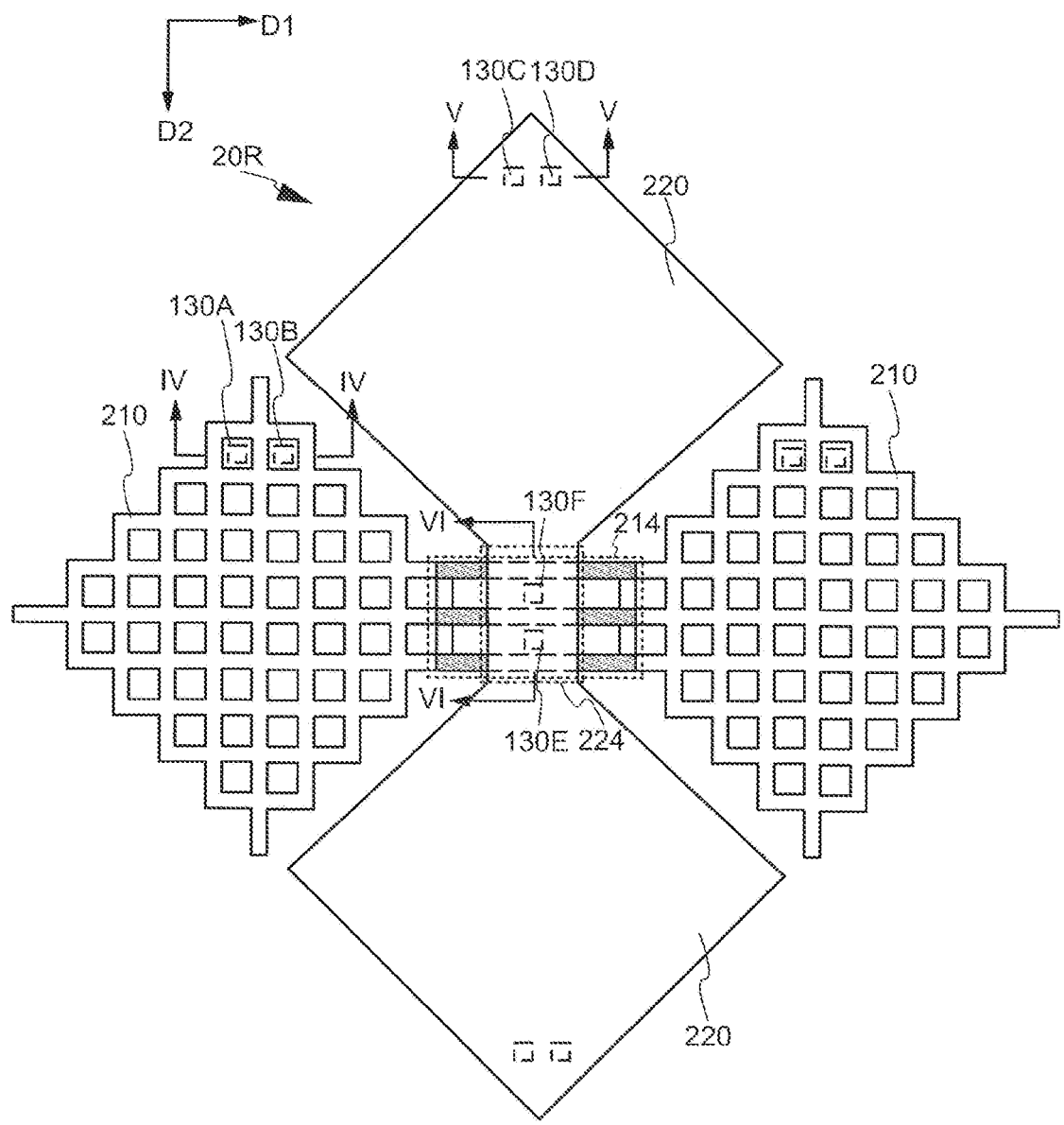
FIG. 3 is a top view showing a part of the touch sensor related to one embodiment of the present invention.

FIG. 3 is an enlarged top view of a region 20R which is a part of the touch sensor 20. The first sensor electrode 210 is formed using a non-translucent material. Here, the non-translucent material is a low resistance metal material. In this case, the first sensor electrode 210 is a metal film. The first sensor electrode 210 is formed in a mesh shape. The metal material is, for example, aluminum (Al). The metal material is not limited to aluminum (Al) and may also be gold (Au), silver (Ag), copper (Cu), palladium (Pd), tungsten (W) or titanium (Ti).

The first sensor electrode 210 overlaps at least a part of a region between two adjacent pixels 130 when viewed from the upper surface of the display device 10. In other words, the first sensor electrode 210 overlaps a partition wall 168 described later arranged between two adjacent pixels 130 and has a mesh shaped pattern opens the upper surface of the pixel 130. In the example in FIG. 3, the first sensor electrode 210 has an opening part in a region which overlaps with a pixel 130A (first pixel) and a pixel 130B (second pixel) and surrounds the pixel 130A and the pixel 130B. As a result, wiring which forms the first sensor electrode 210 is sandwiched between the pixel 130A and the pixel 130B when viewed from the upper surface of the display device 10. The first sensor electrode 210 is aligned so as not to block light emitted from the pixel 130 from passing through to the outside (viewing side) of the display device 10. The line width of the wiring of the first sensor electrode 210 is several μm for example.

Two first sensor electrodes 210 which are adjacent in the direction D1 are electrically connected via a bridge part 214. The bridge part 214 is formed from the same material as the first sensor electrode 210. The first sensor electrode 210 and the bridge part 214 may be physically formed as single integral unit or may be formed as separate bodies. In the example in FIG. 3, the bridge part 214 has an opening part in a region overlapping with a pixel 130E (first pixel) and a pixel 130F (second pixel) and surrounds the pixel 130E and the pixel 130F. Here, although the bridge part 214 is formed by three wirings extending in the direction D1, the bridge part 214 may also be formed from two or less or four or more wirings.

Here, the second sensor electrode 220 is a diamond shaped electrode. For example, the length of a diagonal line of the second sensor electrode 220 is about 5 mm or less. The second sensor electrode 220 has a transparency. In this case, the second sensor electrode 220 is a transparent conductive film. The second sensor electrode 220 overlaps with a plurality of pixels 130 when viewed from the upper surface of the display device 10. That is, the area of the upper surface of the second sensor electrode 220 is larger than the area of one pixel 130. Even in the case when the second sensor electrode 220 is overlapped by the pixel 130, the second sensor electrode 220 transmits the light emitted from the pixel 130 to the outside (viewing side) of the display device 10. In the example in FIG. 3, the second sensor electrode 220 overlaps a pixel 130C and a pixel 130D.

The material of the second sensor electrode 220 is indium zinc oxide (IZO) for example. However, the material which forms the second sensor electrode 220 may also be indium tin oxide (ITO), zinc oxide (ZnO) or indium tin zinc oxide (ITZO) and the like for example.

Two second sensor electrodes 220 which are adjacent to in the direction D2 are electrically connected via a bridge part 224. The bridge part 224 is formed from the same material as the second sensor electrode 220. The second sensor electrode 220 and the bridge part 224 may be physically formed as a single integral unit or may be formed as separate bodies. The bridge part 224 overlaps at least a part of the bridge part 214 when viewed from the upper surface of the display device 10. However, the bridge part 214 and the bridge part 224 are provided on mutually different layers. Therefore, the bridge part 214 and the bridge part 224 are not in physical contact. In the example in FIG. 3, the bridge unit 224 overlaps the pixel 130E and the pixel 130F.

3. Driving the Touch Sensor 20

As is shown in FIG. 2, each of a plurality of first touch sensor wirings 212 and each of a plurality of second touch sensor wirings 222 is electrically connected to the driving circuit 107. The driving circuit 107 supplies a voltage to the first sensor electrode 210 via the plurality of first touch sensor wirings 212. An electric field corresponding to this supplied voltage is generated between the first sensor electrode 210 and the second sensor electrode 220. For example, when a human finger touches the display device 10, the electric field changes between the first sensor electrode 210 and the second sensor electrode 220. In this way, the capacitance between the first touch sensor wiring 212 and the second touch sensor wiring 222 changes. The drive circuit 107 receives an input of a signal from the second sensor electrode 220 included in the touch sensor 20 via the plurality of second touch sensor wirings 222. The display device 10 detects a position touched by a human finger based on this signal.

4. Cross-Sectional Structure

Figure 4:
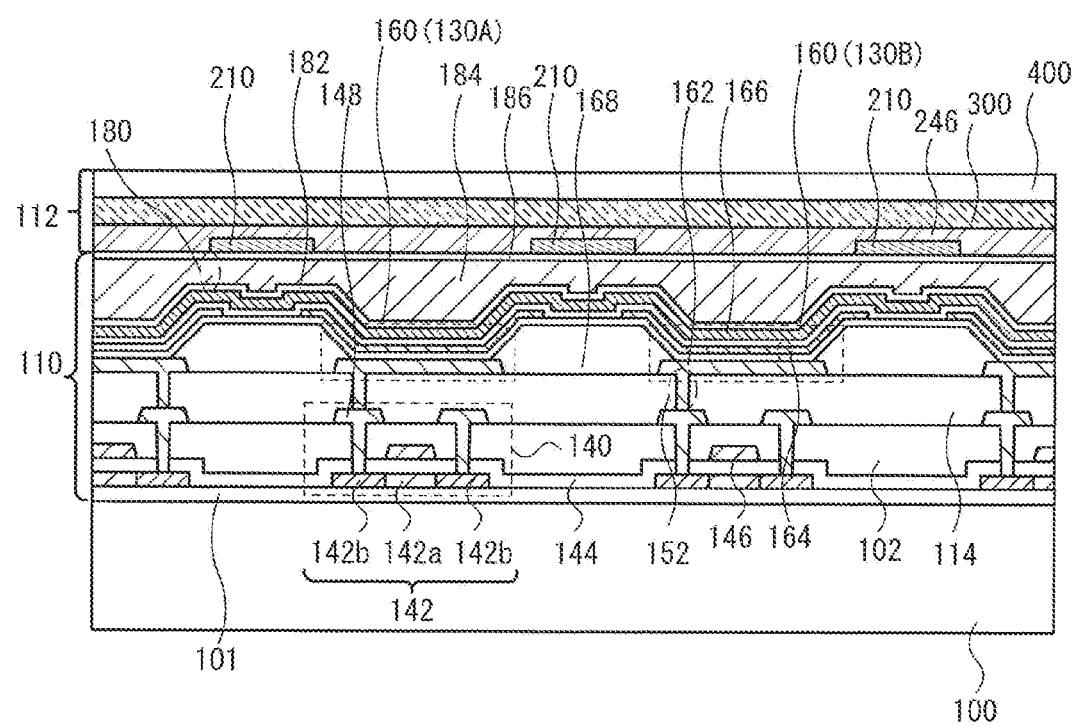
FIG. 4 is a cross-sectional diagram of a region arranged with a first sensor electrode of the display device related to one embodiment of the present invention.

FIG. 4 shows a cross-sectional diagram of a region where the first sensor electrode 210 of the display device 10 is arranged. FIG. 4 is a cross-sectional diagram along the broken line IV-IV in FIG. 3.

The display device 10 has the substrate 100, a lower layer 110 and an upper layer 112. In the case when the substrate 100 has plasticity, the substrate 100 may be referred to as a substrate, a base film or a sheet substrate. The substrate 100 is, for example, an organic resin substrate. In this case, the organic resin material which forms the substrate 100 is polyimide, acrylic, epoxy or polyethylene terephthalate for example. The thickness of the substrate 100 is, for example, between 10 µm and several 100 µm.

First, the lower layer 110 is explained. A transistor 140 is arranged above the substrate 100 interposed by a base film 101. The transistor 140 includes a semiconductor film 142, a gate insulating film 144, a gate electrode 146 and a source/drain electrode 148. The gate electrode 146 overlaps the semiconductor film 142 interposed by the gate insulating film 144. A channel region 142a of the semiconductor film 142 is a region which overlaps the gate electrode 146. The semiconductor film 142 includes source/drain regions 142b which sandwich the channel region 142a. An interlayer film 102 is arranged above the gate electrode 146. The source/drain electrode 148 is electrically connected to the source/drain region 142b at an opening formed in the interlayer film 102 and the gate insulating film 144.

Here, although the transistor 140 is a top gate type transistor, other transistors may also be used. The transistor 140 may be, for example, a bottom gate type transistor, a multi-gate transistor type including a plurality of gate electrodes 146, or a dual gate type transistor having a structure in which the top and bottom of the semiconductor film 142 is sandwiched between two gate electrodes 146.

A planarization film 114 is arranged above the interlayer film 102 and the transistor 140. The upper surface of the planarization film 114 is flat. The planarization film 114 is arranged with a plurality of openings. One of the plurality of openings is a contact hole 152. The contact hole 152 is an opening for electrically connecting the first electrode 162 of the light emitting element 160 described later and the source/drain electrode 148.

A light emitting element 160 is arranged above the planarization film 114. The light emitting element 160 includes a first electrode (pixel electrode) 162, a light emitting layer 164 and a second electrode (counter electrode) 166. The first electrode 162 covers the contact hole 152. The first electrode 162 is electrically connected to the source/drain electrode 148. A partition wall (bank) 168 covers an end part of the first electrode 162. The partition wall 168 covers an end part of the first electrode 162. This prevents disconnection of the light emitting layer 164 and the second electrode 166 which are arranged above the first electrode 162.

The light emitting layer 164 covers the first electrode 162 and the partition wall 168. The second electrode 166 is arranged above the light emitting layer 164. Here, the light emitting layer 164 is manufactured using a low molecular or high molecular weight organic EL material. The light emitting layer 164 emits light according to a voltage supplied to the first electrode 162 and the second electrode 166. Specifically, carriers are injected into the light emitting layer 164 from the first electrode 162 and the second electrode 166. In this way, carriers are recombined inside the light emitting layer 164. The light emitting layer 164 emits light as a result of a process in which light emitting molecules are in an excited state and the excited state relaxes to a ground state. The light emitting layer 164 includes, for example, a carrier injection layer, a carrier transport layer, a light emitting layer, a carrier blocking layer and an exciton blocking layer and the like. That is, the light emitting element 160 is an organic EL element. In the present specification, a pixel refers to a region corresponding to a light emitting region of the light emitting element 160. The light emitting region of the light emitting element 160 is a region where the first electrode 162, the light emitting layer 164 and the second electrode 166 overlap.

A sealing layer 180 is arranged above the light emitting element 160. The sealing layer 180 prevents the entrance of impurities (water, oxygen, etc.) to the light emitting element 160 and the transistor 140 from the exterior. The sealing layer 180 is a layer (first layer) including an inorganic compound. Specifically, the sealing layer 180 includes a first inorganic film 182, an organic film 184 and a second inorganic film 186. For example, the first inorganic film 182 and the second inorganic film 186 are films including an inorganic compound. For example, the first inorganic film 182 and the second inorganic film 186 include an inorganic insulating material such as a silicon nitride film and an aluminum oxide film. The organic film 184 is arranged between the first inorganic film 182 and the second inorganic film 186. The organic film 184 is a film including an organic compound for example. The organic film 184 includes, for example, an organic resin such as an acrylic resin or polysiloxane, a polyimide or a polyester.

Next, the upper layer 112 is explained. The first sensor electrode 210 is arranged above the sealing layer 180. The first sensor electrode 210 includes an opening part in a region which overlaps with the pixel 130A and the pixel 130B seen from the top surface of the display device 10 and surrounds the pixel 130A and the pixel 130B. Specifically, the first sensor electrode 210 is arranged at a position which overlaps the partition wall 168. Therefore, the first sensor electrode 210 does not overlap the light emitting element 160 of the pixels 130A and 130B.

An interlayer insulating film 246 is arranged above the sealing layer 180. The interlayer insulating film 246 is an insulating layer (second layer) which covers the first sensor electrode 210 and the sealing layer 180. The interlayer insulating film 246 includes, for example, an organic resin such as acrylic resin, or polysiloxane, polyimide or polyester and the like.

Furthermore, a substrate 400 is adhered to the interlayer insulating film 246 using an adhesive layer 300. The substrate 400 is a counter substrate facing the substrate 100. The adhesive layer 300 includes, for example, an epoxy resin or an acrylic resin. The substrate 100 and the substrate 400 are, for example, a glass substrate or an organic resin substrate. The substrate 400 has translucency in order to extract light emitted from the light emitting element 160 to the exterior.

Figure 5:
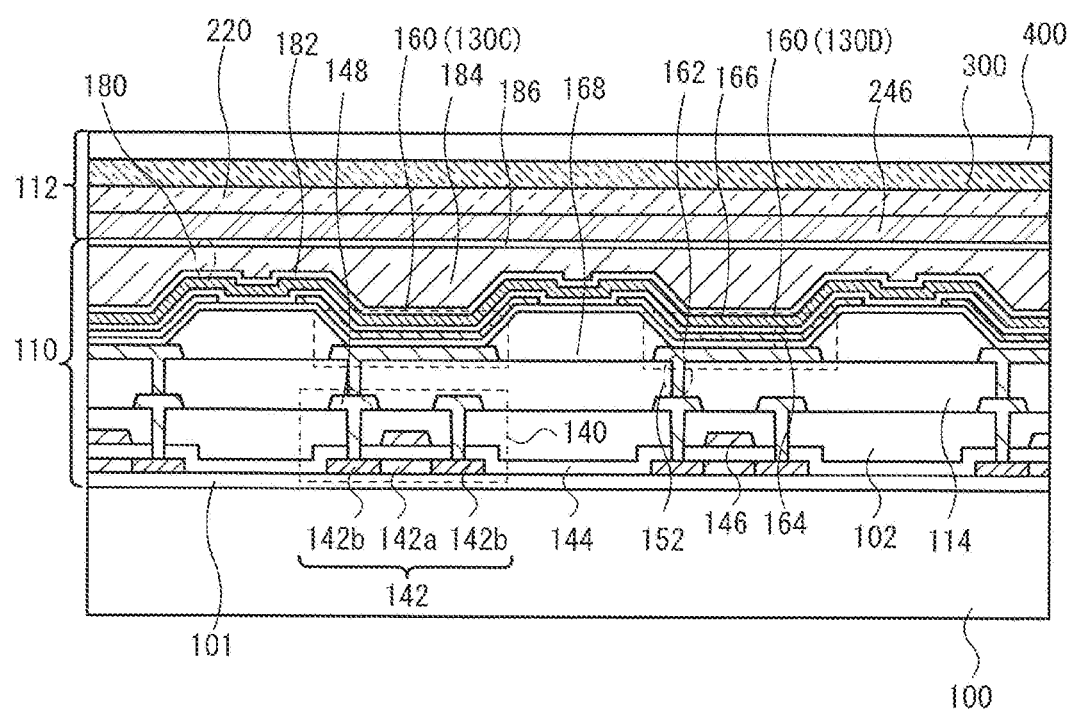
FIG. 5 is a cross-sectional diagram of a region arranged with a second sensor electrode of the display device related to one embodiment of the present invention.

FIG. 5 shows a cross-sectional diagram of a region where the second sensor electrode 220 is arranged in the display device 10. FIG. 5 is a cross section along the broken line V-V in FIG. 3. The structure of the lower layer 110 is the same as in FIG. 4 except that the pixels 130C and 130D are arranged. Therefore, an explanation of the lower layer 110 is omitted.

The interlayer insulating film 246 is arranged above the sealing layer 180. The first sensor electrode 210 is not arranged above the interlayer insulating film 246 in the region where the second sensor electrode 220 is arranged. The second sensor electrode 220 is arranged above the interlayer insulating film 246. Furthermore, the substrate 400 is adhered to the upper surface of the second sensor electrode 220 using the adhesive layer 300.

Figure 6:
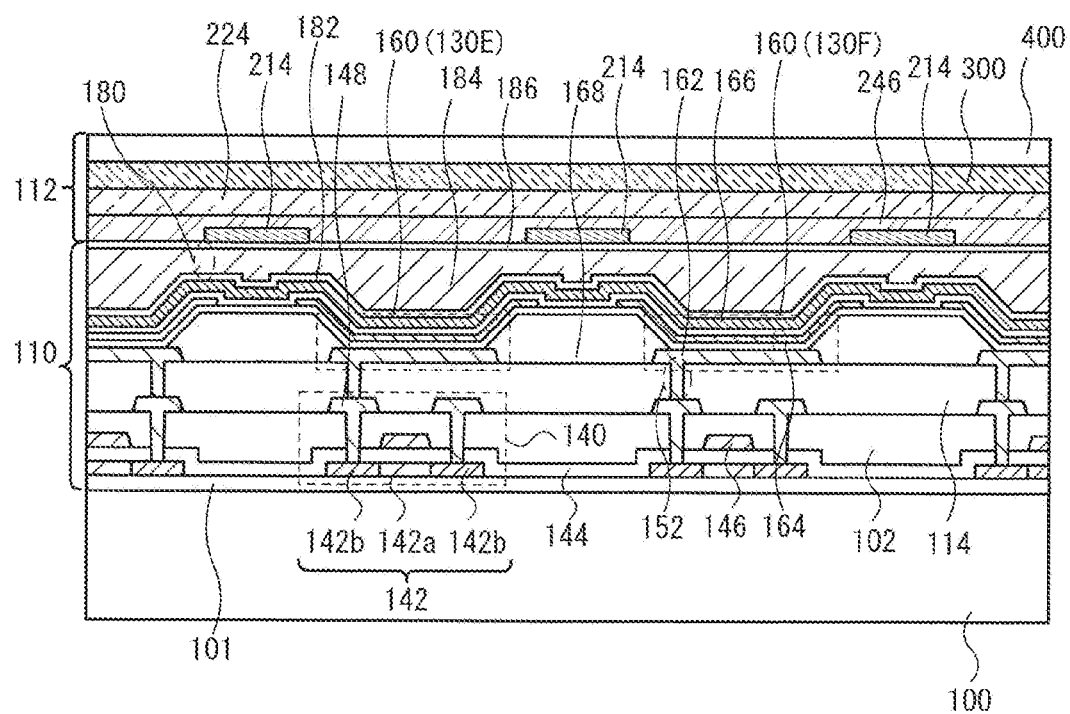
FIG. 6 is a cross-sectional diagram of a region arranged with a bridge part of the display device related to one embodiment of the present invention.

FIG. 6 shows a cross-sectional diagram of a region where the bridge part 214 and the bridge part 224 are arranged in the display device 10. FIG. 6 is a cross section along the broken line VI-VI in FIG. 3. The structure of the lower layer 110 is the same as in FIG. 4 and FIG. 5 except that the pixels 130E and 130F are arranged. Therefore, an explanation of the lower layer 110 is omitted. The bridge part 214 is arranged above the sealing layer 180. The bridge part 214 is covered by the interlayer insulating film 246. The bridge part 224 is arranged above the interlayer insulating film 246. That is, since the bridge part 214 and the bridge part 224 are arranged in different layers, they are not in mutual physical contact. Furthermore, the substrate 400 is adhered to the top of the bridge part 224 using the adhesive layer 300.

In the display device 10 explained above, the first sensor electrode 210 is formed in a mesh shape using a material including mainly metal. The electric resistance of the first sensor electrode 210 is smaller than the electrical resistance of the second sensor electrode 220. Therefore, the detection speed of the touch sensor is improved compared with the case where the first sensor electrode 210 has the same structure as the second sensor electrode 220.

Furthermore, the second sensor electrode 220 has translucency. Therefore, the light emitted from the light emitting element 160 is easily transmitted to the exterior of the display device 10 compared with the case where the second sensor electrode 220 has the same structure as the first sensor electrode 210. In addition, a part of the region in the touch sensor 20 is formed by the first sensor electrode 210, and the remaining regions is formed by the second sensor electrode 220. Although the first sensor electrode 210 is arranged at a position overlapping with the partition wall 168 avoiding the light emitting region of the light emitting element 160, the first sensor electrode 210 is arranged at a position which 210 hinders light emission when viewed from an oblique direction. Therefore, when the entire region of the touch sensor 20 is formed only with the first sensor electrodes 210, the viewing angle becomes narrow. Therefore, the viewing angle of the display device 10 easily becomes larger compared to the case where the entire region of the touch sensor 20 is formed by the first sensor electrodes 210. Therefore, a decrease in display performance of the display device 10 can be suppressed.

In addition, there is sometimes a concern that parasitic capacitance may exist between the second electrode 166 above the light emitting layer 164 and a transmitting electrode which is closer to the second electrode 166 than a receiving electrode. However, because the first sensor electrode 210 formed from a low resistance metal material is the transmitting electrode, the influence of the parasitic capacitance is alleviated.

5. Manufacturing Method of Display Device 10

Figure 7:
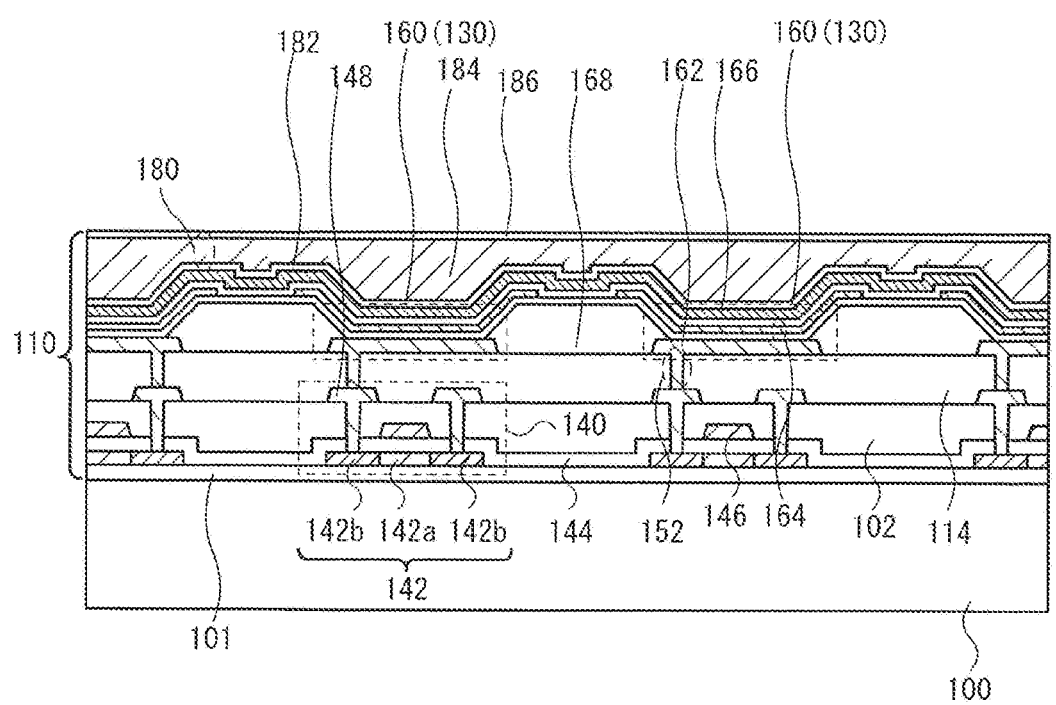
FIG. 7 is a cross-sectional diagram for explaining a manufacturing method of a display device related to one embodiment of the present invention.

An example of a manufacturing method of the display device 10 is explained. FIG. 7 to FIG. 12 are diagrams for explaining the manufacturing method of the display device 10. After the lower layer 110 shown in FIG. 7 is manufactured, the upper layer 112 is manufactured by the method explained below. Manufacture of the upper layer 112 is carried out by a process at less than 100 degrees Celsius while considering the heat resistance of the light emitting element 160.

Figure 8:
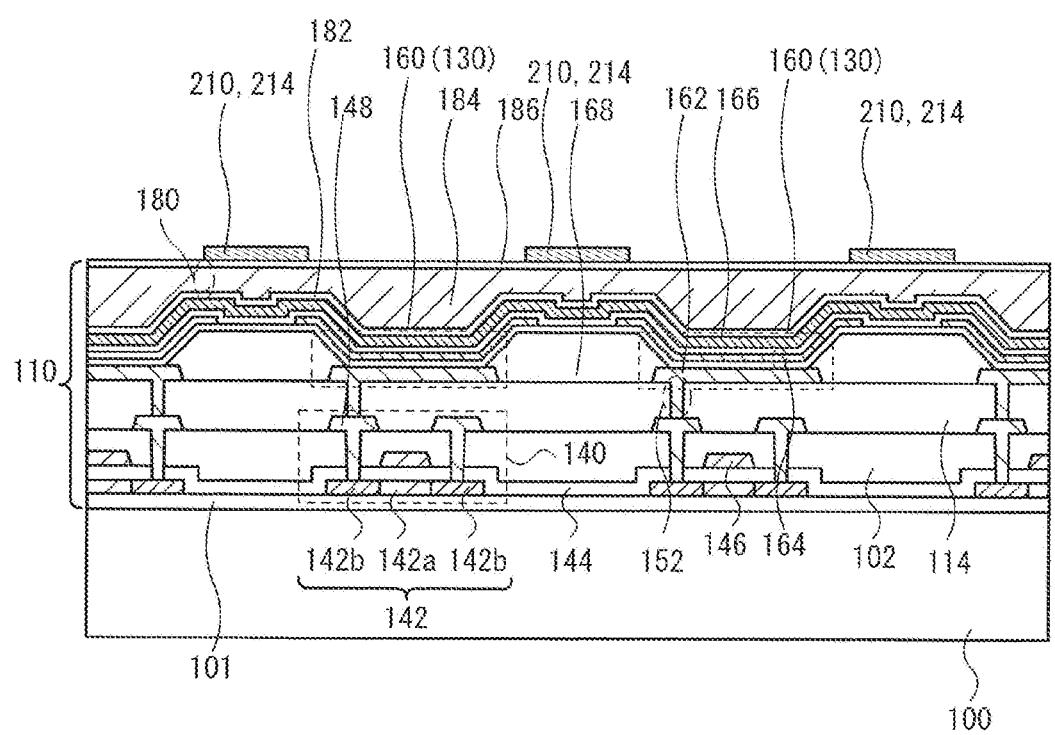
FIG. 8 is a cross-sectional diagram for explaining a manufacturing method of the display device related to one embodiment of the present invention.
Figure 9:
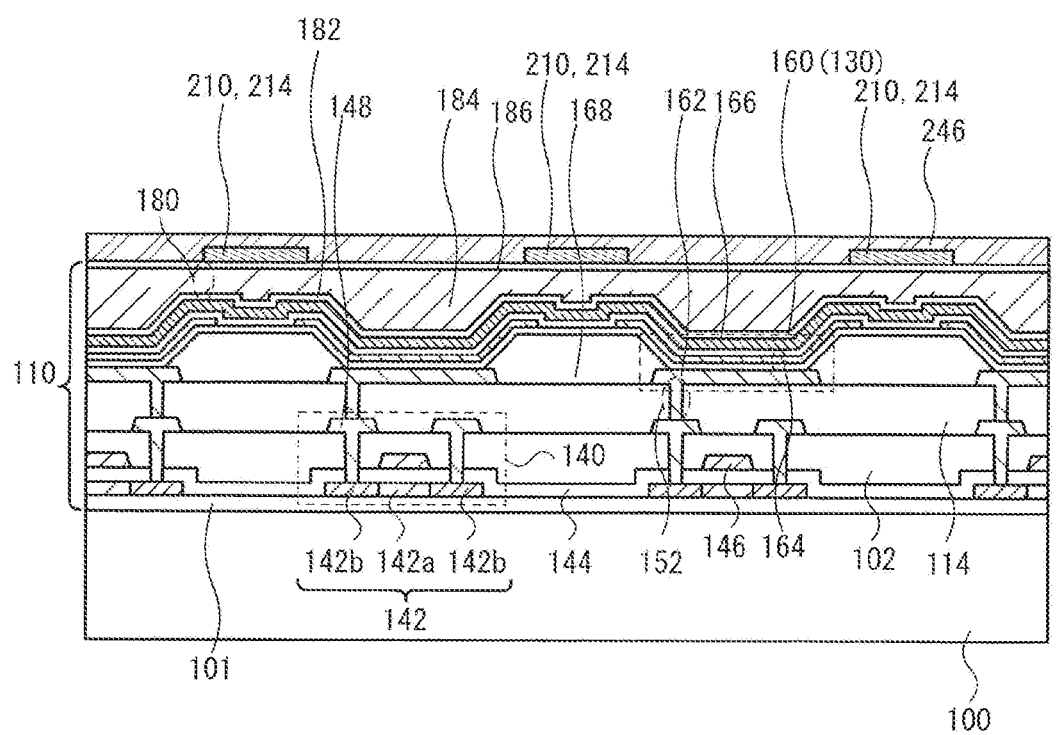
FIG. 9 is a cross-sectional diagram for explaining a manufacturing method of the display device related to one embodiment of the present invention.

FIG. 8 is a diagram for explaining a first step of the method of manufacturing the display device 10. FIG. 8 shows a cross section of a region where the first sensor electrode 210 is arranged and a region where the bridge part 214 is arranged after the first step. In FIG. 8 and FIG. 9 described later, the positions where the first sensor electrode 210 and the bridge part 214 are arranged are shown together with the reference numbers of the first sensor electrode 210 and the bridge part 214 to simplify the explanation.

In the first step, the first sensor electrode 210 and the bridge part 214 are formed above the sealing layer 180. In the first step, for example, the first sensor electrode 210 and the bridge part 214 are formed by a sputtering method. However, the first step is not limited to a sputtering method and an evaporation method, a printing method or an inkjet method and the like may also be used. In the first step, after an electrode including a metal or an alloy is formed on almost the entire surface of the sealing layer 180 using a CVD method or a sputtering method, a resist is formed and etched (that is, a photolithography process).

Figure 10:
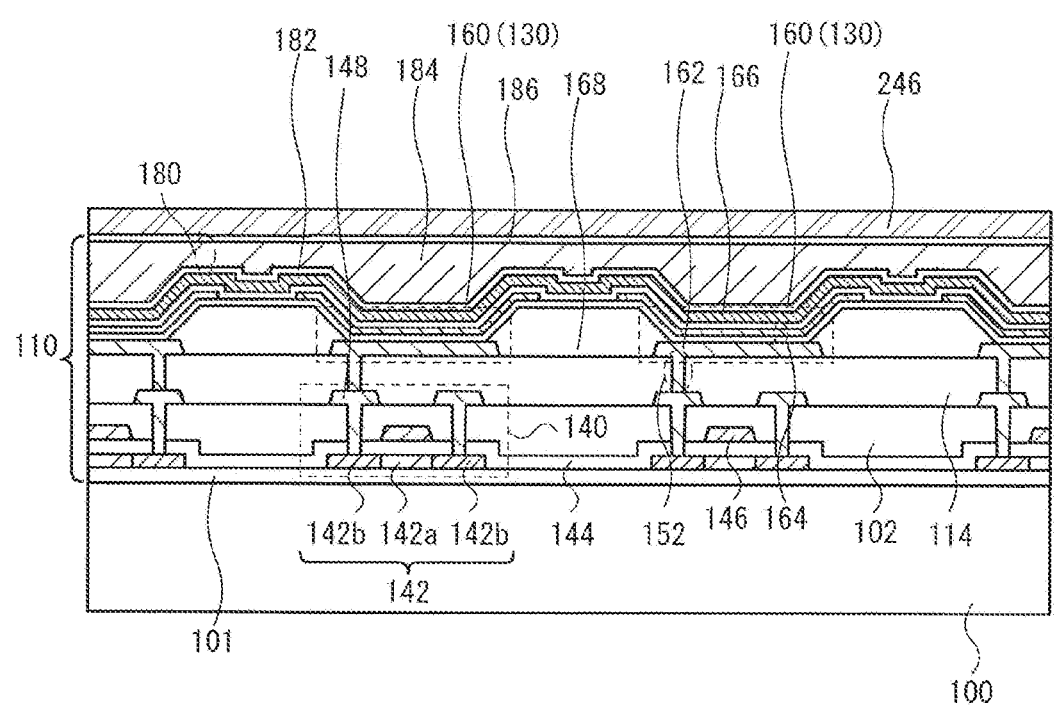
FIG. 10 is a cross-sectional diagram for explaining a manufacturing method of the display device related to one embodiment of the present invention.

FIG. 9 and FIG. 10 are diagrams for explaining a second step of the manufacturing method of the display device 10. FIG. 9 shows a cross section of a region where the first sensor electrode 210 is arranged and a region where the bridge part 214 is arranged after the second step. FIG. 10 shows a cross section of a region where the second sensor electrode 220 is arranged after the second step.

In the second step, the interlayer insulating film 246 is formed above the sealing layer 180. The interlayer insulating film 246 contains an organic resin including acrylic resin or polysiloxane, or polyimide and polyester and the like. In the second step, the interlayer insulating film 246 is formed by a wet film formation method such as an ink jet method for example.

Figure 11:
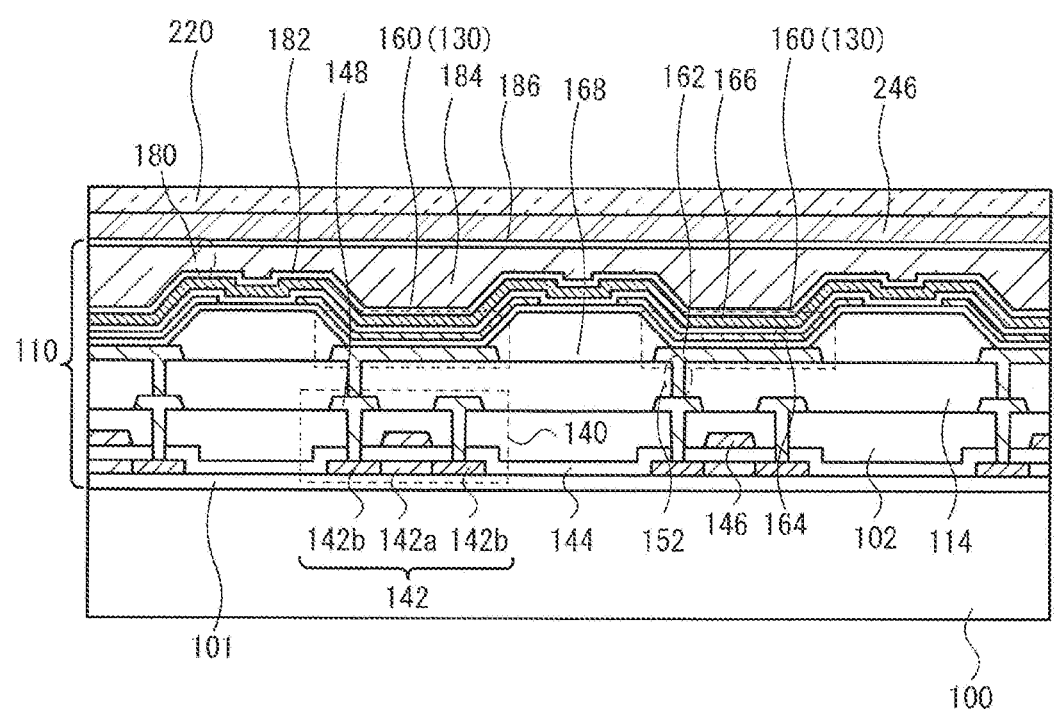
FIG. 11 is a cross-sectional diagram for explaining a manufacturing method of a display device related to one embodiment of the present invention.
Figure 12:
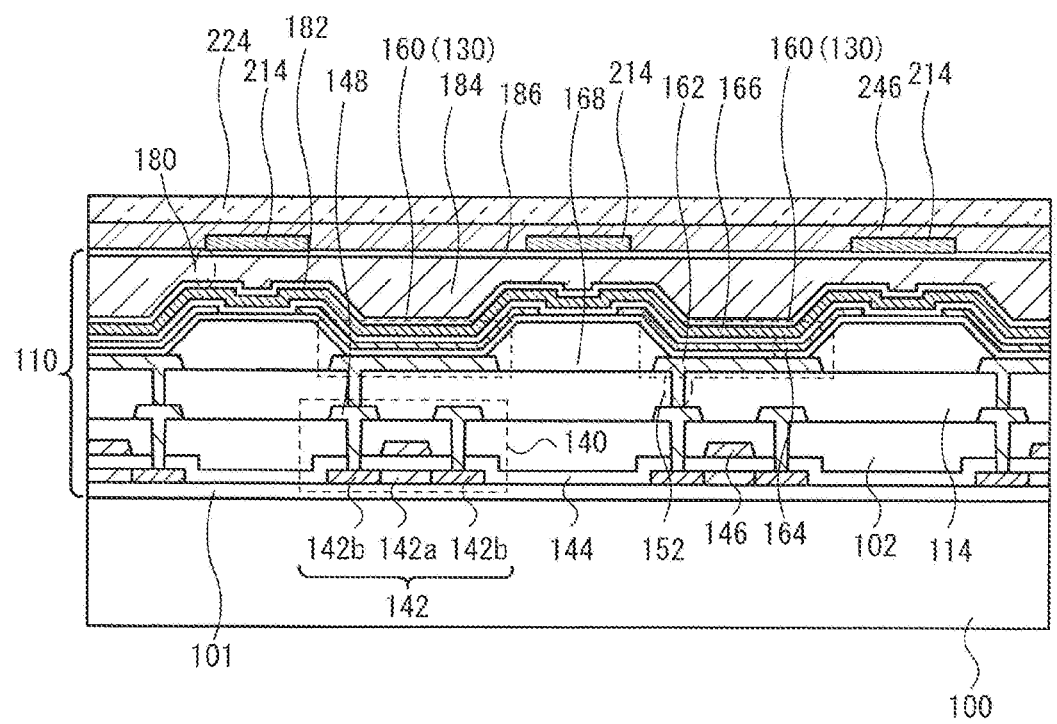
FIG. 12 is a cross-sectional diagram for explaining a manufacturing method of the display device related to one embodiment of the present invention.

FIG. 11 and FIG. 12 are diagrams for explaining a third step of the method of manufacturing the display device 10. FIG. 11 shows a cross section of a region where the second sensor electrode 220 is arranged after the third step. FIG. 12 shows a cross section of a region where the bridge part 224 is arranged after the third step.

In the third step, the second sensor electrode 220 and the bridge part 224 are formed above the interlayer insulating film 246. In the third step, for example, the second sensor electrode 220 and the bridge part 224 are formed by a sputtering method. The third step is not limited to a sputtering method and a vapor deposition method, a printing method, a coating method and a molecular beam epitaxy method (MBE) or the like may also be used. In the third step, after film formation, the second sensor electrode 220 and the bridge part 224 are processed by a photolithography method and an etching method. The material of the second sensor electrode 220 is, for example, indium zinc oxide (IZO), indium tin oxide (ITO), zinc oxide (ZnO) or indium tin zinc oxide (ITZO).

Subsequently, the substrate 400 which is counter substrate is bonded to the substrate 100 using the adhesive layer 300. The upper layer 112 is completed through the steps described above.

According to the manufacturing method of the display device 10, even in the case when the touch sensor 20 is manufactured by low temperature process at 100 degrees Celsius or less, it is possible to improve the detection speed of the touch sensor and suppressing a decrease in display performance.

In addition, the first sensor electrode 210 is a transmitting electrode of the touch sensor 20. The second sensor electrode 220 is a receiving electrode of the touch sensor 20. The first sensor electrode 210 is formed above the sealing layer 180. The second sensor electrode 220 is formed above the interlayer insulating film 246.

Since the first sensor electrode 210 has an opening part in a region which overlaps two adjacent pixels 130 and is arranged to surround the two pixels 130, an alignment accuracy of the first sensor electrode 210 is higher than that of the second sensor electrode 220 is required. Therefore, in the manufacturing method of the display device 10, alignment accuracy can be easily ensured by forming the first sensor electrode 210 on a layer lower than the second sensor electrode 220.

6. Modification Examples

The embodiments described above can be applied by being combined or replaced with each other. In addition, in the embodiment described above, it is also possible to carry out the invention by modifications as follows.

Modification Example 1

In the touch sensor 20, the second sensor electrode 220 may be a transmitting electrode and the first sensor electrode 210 may be a receiving electrode. In addition, a part (a half for example) of the plurality of first sensor electrodes 210 arranged in the touch sensor 20 may be a transmitting electrode and the remaining first sensor electrodes 210 may be receiving electrodes. In addition, a part (a half for example) of the plurality of second sensor electrodes 220 arranged in the touch sensor 20 may be a transmitting electrode and the remaining second sensor electrodes 220 may be receiving electrodes.

Modification Example 2

Figure 13:
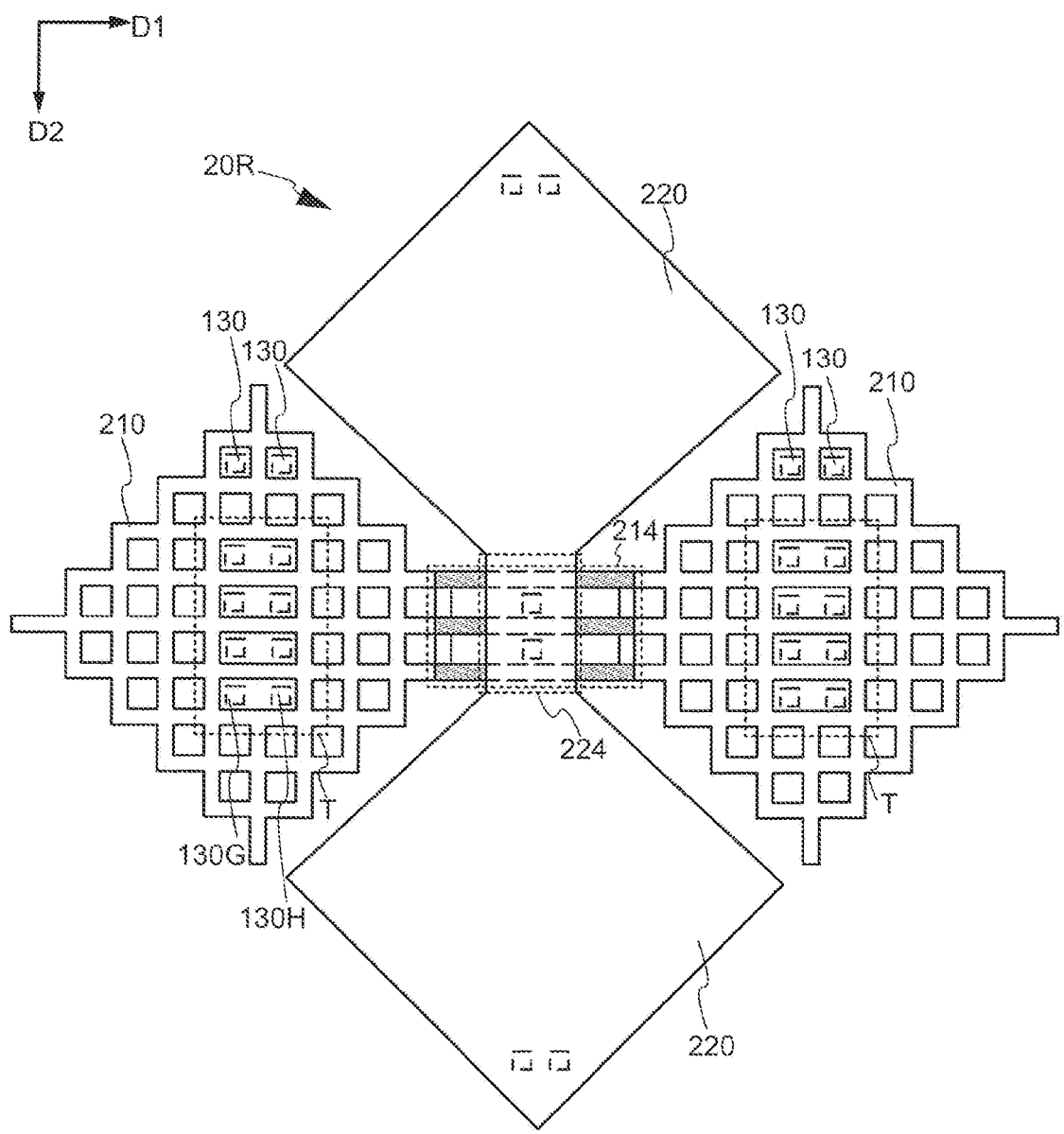
FIG. 13 is a top view showing a part of a touch sensor related to one modified example of the present invention.

The touch sensor 20 may include a region having a relatively low wiring density in a region surrounded by the first sensor electrode 210. The wiring density refers to a ratio of a region where the wiring of the first sensor electrode 210 is arranged per unit area. FIG. 13 is a top view showing a region 20R which is a part of the touch sensor 20 according to this modification example. As is shown in FIG. 13, the density of the wiring of the first sensor electrode 210 is low region T where a part of a region that the first sensor electrode 210 is arranged. For example, in the region T, the first sensor electrode 210 is not arranged in a region between two pixels 130 which are spaced apart from each other and are adjacent in the direction D1. For example, the first sensor electrode 210 is not arranged in a region between a pixel 130G (fourth pixel) and a pixel 130H (fifth pixel). The pixel 130G and the pixel 130H are arranged adjacent to each other. In this way, in the region where the second sensor electrode 220 is arranged and the region T, light easily passes through in an oblique direction to the exterior of the display device 10 (that is, the viewing angle increases). In addition, even if a misalignment occurs in the relative positional relationship between the pixel 130 and the first sensor electrode 210 during manufacture, it is more difficult for light emitted from the pixel 130 to be blocked by the first sensor electrode 210. As a result, the yield is improved and it is possible to reduce costs. In addition, the density of the wiring of the first sensor electrode 210 changes according to the line width of the wiring as well as the number of wirings. However, if the wiring width is too narrow, defects such as light emission failure due to variations in line width may occur. Therefore, by adopting the structure of the present modification example, it is possible to further improve display performance and suppressing the occurrence of such defects.

Modification Example 3

A part of structure explained in the embodiments descry above may be omitted or changed. For example, in the display device 10, the second sensor electrode 220 may be arranged at a position closer to the light emitting layer 164 than the first sensor electrode 210. In addition, the cross-sectional structures of the lower layer 110 and the upper layer 112 are only examples and some layers may be omitted or another layer may be arranged. In addition, although the touch sensor 20 is an on-cell type sensor, the touch sensor 20 may be formed as an out-cell type touch sensor for example.

Modification Example 4

In the present specification, although the case of an organic EL display device has been exemplified as a disclosed example, liquid crystal display devices, other self-light emitting type display devices or electronic paper type display devices having electrophoretic elements and the like, and any flat panel type display device can be exemplified as another application example.

Furthermore, within the spirit of the present invention, it is to be understood that a person ordinarily skilled in the art could conceive of each type of modified example and corrected example and that these modified examples and corrected examples also belong to the scope of the present invention. For example, appropriate additions, deletions or changes to the design of constituent elements with respect to each embodiment previously described, or those in which processes are added, omitted or conditions are changed by a person ordinarily skilled in the art are included within the scope of the present invention as long as they include the concept of the present invention.

What is claimed is:

1. A display device comprising:
a display region including a first pixel and a second pixel arranged apart from each other, and a third pixel;
a touch sensor including a first sensor electrode and a second sensor electrode; and
a second layer between the first sensor electrode and the second sensor electrode,
wherein
the touch sensor overlaps the display region,
each of the first pixel, the second pixel and the third pixel has a light emitting area,
the first sensor electrode comprises a non-translucent metal film and has an opening part,
the non-translucent metal film does not overlap the light emitting area of the first pixel and the light emitting area of the second pixel,
the opening part transmits a light from the first pixel or the second pixel,
the second sensor electrode has a transparent conductive oxide film,
the transparent conductive oxide film overlaps the light emitting area of the third pixel without overlapping with the first sensor electrode in a plan view,
the transparent conductive oxide film transmits a light from the third pixel, and
a top surface and a side surface of the first sensor electrode are directly in contact with the second layer.

2. The display device according to claim 1, wherein one of the first sensor electrode and the second electrode is a transmitting electrode and the other is a receiving electrode.

3. The display device according to claim 2, wherein the first sensor electrode is a transmitting electrode and the second sensor electrode is a receiving electrode.

4. The display device according to claim 1, wherein the first sensor electrode is arranged above a first layer, the first sensor electrode is covered by the second layer, and the second sensor electrode is arranged above the second layer.

5. The display device according to claim 4, wherein the first layer is closer to a light emitting layer of the first pixel, the second pixel and the third pixel than the second layer.

6. The display device according to claim 5, wherein the first layer includes an inorganic compound, and the second layer is an insulation layer arranged above the first layer.

7. The display device according to claim 4, wherein
a bottom surface of the first sensor electrode and the second layer are directly in contact with the first layer successively.

8. The display device according to claim 1, further comprising:
wherein a fourth pixel and a fifth pixel are arranged adjacent to each other and arranged apart from each other, and
the first sensor electrode is not arranged in a region between the fourth pixel and the fifth pixel in a region surrounded by the first sensor electrode.

9. The display device according to claim 1, wherein the first pixel, the second pixel and the third pixel include an organic EL element.

10. The display device according to claim 1, further comprising:
a first touch sensor wiring arranged with a plurality of the first sensor electrodes in a first direction, and
a second touch sensor wiring arranged with a plurality of the second sensor electrodes in a second direction intersecting the first direction.

11. The display device according to claim 1, wherein the first sensor electrode and the second sensor electrode are next to each other in a plan view.

12. The display device according to claim 11, wherein the second sensor electrode is next to sensor electrodes including the first electrode in a plan view, and
each of the sensor electrodes has opening parts in a region overlapping pixels.

* * * * *